US008258053B2

(12) United States Patent
Kronholz et al.

(10) Patent No.: US 8,258,053 B2
(45) Date of Patent: Sep. 4, 2012

(54) PERFORMANCE ENHANCEMENT IN TRANSISTORS COMPRISING HIGH-K METAL GATE STACK BY REDUCING A WIDTH OF OFFSET SPACERS

(75) Inventors: Stephan Kronholz, Dresden (DE); Matthias Kessler, Dresden (DE); Andreas Kurz, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 54 days.

(21) Appl. No.: 12/900,578

(22) Filed: Oct. 8, 2010

(65) Prior Publication Data

US 2011/0129971 A1     Jun. 2, 2011

(30) Foreign Application Priority Data

Nov. 30, 2009  (DE) .......................... 10 2009 047 314

(51) Int. Cl.
  *H01L 21/3205*  (2006.01)
  *H01L 21/4763*  (2006.01)
(52) U.S. Cl. ............ 438/595; 438/3; 438/199; 438/240; 257/E21.114; 257/E21.274; 257/E21.277; 257/E21.477
(58) Field of Classification Search .............. 438/3, 199, 438/240, 595; 257/E21.114, E21.274, E21.277, 257/E21.477
See application file for complete search history.

(56) References Cited

U.S. PATENT DOCUMENTS

| 7,052,946 B2 * | 5/2006 | Chen et al. ..................... 438/199 |
| 7,875,520 B2 * | 1/2011 | Wu et al. ....................... 438/300 |
| 2007/0128786 A1 * | 6/2007 | Cheng et al. ................... 438/199 |
| 2009/0218633 A1 * | 9/2009 | Hoentschel et al. .......... 257/369 |
| 2010/2194741 | 9/2010 | Kronholz et al. ............. 257/347 |
| 2011/0062519 A1 * | 3/2011 | Pal et al. ....................... 257/347 |

FOREIGN PATENT DOCUMENTS

DE   102009010882 A1   9/2010

OTHER PUBLICATIONS

Translation of Official Communication from German Patent Office for German Patent Application No. 10 2009 047 314.9 dated Mar. 11, 2011.

* cited by examiner

*Primary Examiner* — Michelle Mandala
(74) *Attorney, Agent, or Firm* — Williams, Morgan & Amerson, P.C.

(57) ABSTRACT

In sophisticated semiconductor devices including transistors having a high-k metal gate electrode structure, disposable spacers may be provided on the encapsulating spacer element with a reduced width so as to not unduly increase a lateral offset of a strain-inducing material to be incorporated into the active region. For this purpose, a multi-layer deposition may be used in combination with a low pressure CVD process.

18 Claims, 5 Drawing Sheets

PERFORMANCE ENHANCEMENT IN TRANSISTORS COMPRISING HIGH-K METAL GATE STACK BY REDUCING A WIDTH OF OFFSET SPACERS

BACKGROUND OF THE INVENTION

1. Field of the Invention

Generally, the present disclosure relates to the fabrication of integrated circuits, and, more particularly, to P-channel transistors comprising a high-k metal gate electrode formed in an early manufacturing stage.

2. Description of the Related Art

The fabrication of complex integrated circuits requires the provision of a large number of transistor elements, which represent the dominant circuit element in complex integrated circuits. For example, several hundred millions of transistors may be provided in presently available complex integrated circuits. Generally, a plurality of process technologies are currently practiced, wherein, for complex circuitry, such as microprocessors, storage chips and the like, CMOS technology is currently the most promising approach due to the superior characteristics in view of operating speed and/or power consumption and/or cost efficiency. In CMOS circuits, complementary transistors, i.e., P-channel transistors and N-channel transistors, are used for forming circuit elements, such as inverters and other logic gates to design highly complex circuit assemblies, such as CPUs, storage chips and the like. During the fabrication of complex integrated circuits using CMOS technology, millions of transistors, i.e., N-channel transistors and P-channel transistors, are formed on a substrate including a crystalline semiconductor layer. A MOS transistor, or generally a field effect transistor, irrespective of whether an N-channel transistor or a P-channel transistor is considered, comprises so-called PN junctions that are formed by an interface of highly doped drain and source regions and an inversely or weakly doped channel region disposed between the drain region and the source region. The conductivity of the channel region, i.e., the drive current capability of the conductive channel, is controlled by a gate electrode formed in the vicinity of the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Thus, the reduction of the channel length, and associated therewith the reduction of the channel resistivity, is a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. For example, highly sophisticated dopant profiles, in the vertical direction as well as in the lateral direction, are required in the drain and source regions to provide low sheet and contact resistivity, in combination with a desired channel controllability.

Upon continuously reducing the channel length of field effect transistors, generally, an increased degree of capacitive coupling is required in order to maintain controllability of the channel region, which may typically require an adaptation of a thickness and/or material composition of the gate dielectric material. For example, for a gate length of approximately 80 nm, a gate dielectric material based on silicon dioxide with a thickness of less than 2 nm may be required in high speed transistor elements, which may, however, result in increased leakage currents caused by hot carrier injection and direct tunneling of charge carriers through the extremely thin gate dielectric material. Since a further reduction in thickness of silicon dioxide-based gate dielectric materials may increasingly become incompatible with thermal power requirements of sophisticated integrated circuits, other alternatives have been developed in increasing the charge carrier mobility in the channel region, thereby also enhancing overall performance of field effect transistors. One promising approach in this respect is the generation of a certain type of strain in the channel region, since the charge carrier mobility in silicon strongly depends on the strain conditions of the crystalline material. For example, for a standard crystallographic configuration of the silicon-based channel region, a compressive strain component in a P-channel transistor may result in a superior mobility of holes, thereby increasing switching speed and drive current of P-channel transistors. The desired compressive strain component may be obtained according to well-established approaches by incorporating a strain-inducing semiconductor material, for instance in the form of a silicon/germanium mixture or alloy, in the active region of the P-channel transistor. For example, after forming the gate electrode structure, corresponding cavities may be formed laterally adjacent to the gate electrode structure in the active region and may be refilled with the silicon/germanium alloy which, when grown on the silicon material, may have an internal strained state, which in turn may induce a corresponding compressive strain component in the adjacent channel region.

During the continuous reduction of the critical dimensions of transistors, an appropriate adaptation of the material composition of the gate dielectric material has been proposed such that, for a physically appropriate thickness of a gate dielectric material, i.e., for reducing the gate leakage currents, a desired high capacitive coupling may nevertheless be achieved. Thus, material systems have been developed which have a significantly higher dielectric constant, compared to the conventionally used silicon dioxide-based materials, silicon oxynitride materials and the like. For example, materials including hafnium, zirconium, aluminum and the like may have a significantly higher dielectric constant and are, therefore, referred to as high-k dielectric materials, which are to be understood as materials having a dielectric constant of 10.0 or higher when measured in accordance with typical measurement techniques. As is well known, the electronic characteristics of the transistor elements also strongly depend on the work function of the gate electrode material, which influences the band structure of the semiconductor material in the channel region separated from the gate electrode material by the gate dielectric material. In well-established polysilicon/silicon dioxide-based gate electrode structures, the corresponding threshold voltage, strongly influenced by the gate dielectric material and the adjacent electrode material, is adjusted by appropriately doping the polysilicon material in order to appropriately adjust the work function of the polysilicon material at the interface between the gate dielectric material and the electrode material. Similarly, in gate electrode structures including a high-k gate dielectric material, the work function has to be appropriately adjusted for N-channel transistors and P-channel transistors, respectively, which may require appropriately selected work function adjusting metal species, such as lanthanum for N-channel transistors and aluminum for P-channel transistors. For this reason, corresponding metal-containing conductive materials may be positioned close to the high-k gate dielectric material in order to form an appropriately designed interface that results in the target work function of the gate electrode structure. In many conventional approaches, the work function adjustment may be performed at a very late manufacturing stage, i.e., after any high temperature processes, which may require the replacement of a placeholder material of the gate electrode structures, such as polysilicon, and the incorporation of appropriate work function adjusting species in combination with an electrode metal, such as aluminum and the like. In this case, however, very complex patterning and deposition process sequences may be required on the basis of gate electrode structures having critical dimensions of 50 nm and significantly less, which may result in severe variations of the resulting transistor characteristics.

Therefore, other process strategies have been proposed in which the work function adjusting materials may be applied in an early manufacturing stage, i.e., upon forming the gate electrode structures, wherein the corresponding metal species may be thermally stabilized and encapsulated in order to obtain the desired work function and thus threshold voltage of the transistors without being unduly influenced by the further processing.

Consequently, process techniques have been developed in which superior gate electrode structures on the basis of a high-k dielectric material may be implemented together with efficient strain-inducing mechanisms, such as a silicon/germanium alloy material, incorporated in the drain and source regions in an attempt to further enhance overall device performance. It turns out, however, that these mechanisms may interact with each other, thereby resulting in a less pronounced gain of performance or even in a reduced overall performance compared to sophisticated P-channel transistors in which only one of these mechanisms is implemented. With reference to FIGS. 1a-1d, a conventional process strategy will be described in more detail so as to more clearly demonstrate the problems associated with the incorporation of a strain-inducing silicon/germanium alloy in the presence of an appropriately encapsulated high-k metal gate electrode structure.

FIG. 1a schematically illustrates a cross-sectional view of a semiconductor device 100 comprising a substrate 101 and a silicon-based semiconductor layer 102, which in turn comprises semiconductor regions or active regions 102A, 102B. It should be appreciated that the active regions 102A, 102B may be laterally delineated by isolation structures (not shown), such as shallow trench isolations. Moreover, in the manufacturing stage shown, the device 100 comprises a P-channel transistor 150A and an N-channel transistor 150B. In this manufacturing stage, the transistors 150A, 150B comprise gate electrode structures 160A, 160B, respectively, each of which included a gate dielectric material 161 that is formed on the basis of a high-k dielectric material. For example, the gate dielectric materials may comprise a dielectric base layer, such as a silicon oxide base material in combination with a high-k dielectric material, such as hafnium oxide and the like. Moreover, the gate electrode structure 160A comprises a metal-containing electrode material 162A, possibly in combination with a work function adjusting metal species, such as aluminum and the like. In other cases, the work function adjusting metal species may be incorporated in the dielectric material 161, depending on the overall process strategy. Similarly, the gate electrode structure 160B comprises an electrode metal 162B, possibly having incorporated therein an appropriate work function metal species, such as lanthanum, while in other cases the work function metal species may be incorporated in the dielectric material 161. Moreover, both electrode structures 160A, 160B comprise a semiconductor-based electrode material 163, such as amorphous silicon, polysilicon and the like. Finally, a dielectric cap material 164 is provided in both gate electrode structures. Furthermore, a protective spacer element 103 is formed on sidewalls of the gate electrode structures 160A, 160B followed by a further spacer 104 which may act as an etch stop material upon removing the dielectric cap material 164 in a later manufacturing stage. It should be appreciated that the spacer element 103, typically comprised of silicon nitride, may be used to maintain integrity of the sensitive materials 161 and 162A, 162B after patterning the gate electrode structures 160A, 160B. In particular, any interaction with aggressive chemicals may be reduced, such as sulfuric acid in combination with hydrogen peroxide and the like, which may frequently be used during the further processing. Additionally, in the manufacturing stage shown, a spacer element 105S is formed on the sidewalls of the gate electrode structure 160A, while a spacer layer 105 covers the active region 102B and the gate electrode structure 160B Furthermore, the active region 102A may comprise a strain-inducing semiconductor alloy 151, such as a silicon/germanium alloy, in order to provide a desired strain component, i.e., in the example shown, a compressive strain component in the channel region 152. Furthermore, in some cases, a different band structure may be required at the interface between the channel region 152 and the dielectric material 161 in order to appropriately adapt the threshold voltage of the transistor 150A, which may be accomplished by providing a silicon/germanium material 152A and the like.

The semiconductor device 100 as illustrated in FIG. 1a may be formed on the basis of well-established and sophisticated process techniques in the following manner. After providing the active regions 102A, 102B, for instance based on isolation structures, the optional material 152A, if required, may be selectively formed in the active region 102A, for instance on the basis of epitaxial growth techniques. Thereafter, the material system for at least the layers 161 and 162A, 162B may be formed by any appropriate deposition or other process techniques, wherein also the required work function adjusting metal species, such as aluminum, lanthanum and the like, may be incorporated in the materials 162A, 162B and/or the dielectric materials 161, for instance by initiating diffusion based on an anneal process and the like. For this purpose, a plurality of different process strategies may be applied. Thereafter, the material 163 may be formed, for instance by low pressure chemical vapor deposition (CVD), followed by the deposition of the dielectric cap material 164, which may include two or more individual material layers, if required. Additionally, any other materials, such as hard mask materials and the like, may be deposited, as required by the following patterning process. Based on complex lithography and etch techniques, the gate electrode structures 160A, 160B are formed in accordance with the design rules of the device 100, thereby obtaining a gate length, i.e., in FIG. 1a, the horizontal extension of the gate electrode structures 160A, 160B, of 40 nm and less. Since the threshold voltage of the transistors 150A, 150B is substantially determined by the configuration of the channel region 152 in combination with the materials 161 and 162A, 162B, any significant modification, in particular of the materials 161 and 162A, 162B, is to be avoided during the further processing. Consequently, a liner material, such as a silicon nitride material, may be deposited and may be patterned into the spacer element 103. Additionally, the spacer 104, for instance in the form of an oxide material, may be formed by depositing an oxide layer and patterning the same into the spacer element 104. Typically, a width of the spacer 103 may be in the range of 3 nm and less in sophisticated applications, wherein, however, a further reduction in spacer width may result in reduced production yield due to undue modification of the materials 161, 162A, 162B. Similarly, the spacer element 104 may have a certain width, for instance in the range of 5-10 nm, so as to act as an efficient etch stop material in a further advanced manufacturing stage. Thereafter, the spacer layer 105 is formed, for instance, by well-established low pressure CVD techniques, thereby providing a thermally stable and moderately dense silicon nitride material, which may provide the desired etch resistivity during the subsequent processing. The spacer layer 105 is then selectively patterned into the spacer element 105S by providing an etch mask, such as a resist mask, above the active region 102B while exposing the transistor 150A and thus the spacer layer 105 to an anisotropic etch atmosphere. Thus the width of the spacer element 105S, which may be in the range of 8-10 nm in sophisticated applications, is substantially determined by the initial thickness of the spacer layer 105 and the parameters of the subsequent plasma assisted etch process, which may have a certain lateral etch rate. Based on the spacer element 105S, the processing is continued by etching into the active region 102A, thereby using the dielectric cap layer 164 and the spacer element 105S as an etch mask. During this anisotropic etch process, the lateral offset of the resulting cavities from the gate electrode structure 160A is, therefore, substantially determined by the combined width of the spacers 103, 104 and 105S. Hence, upon refilling the cavities with the strain-inducing semiconductor alloy 151, the lateral offset of the material 151 is thus determined by the spacers 103, 104 and 105S.

It should be appreciated that the resulting compressive strain component in the channel region 152 is affected by the internal strain component of the material 151, which in turn is determined by the germanium concentration of the silicon/germanium alloy. Since the germanium concentration may not be arbitrarily increased based on available selective epitaxial growth techniques unless creating severe crystal faults, and since the amount of the material 151 is substantially determined by the overall configuration of the transistor 150A, for instance in terms of a thickness of the semiconductor layer 102, the lateral offset of the material 151 is an important factor in increasing the strain and thus performance of the transistor 150A. Consequently, the additional lateral offset caused by the spacer elements 103 and 104, compared to sophisticated approaches, without requiring encapsulation of the gate electrode structure 160A, may result in a significantly reduced strain in the channel region 152.

FIG. 1b schematically illustrates the device 100 in a further advanced manufacturing stage. As illustrated, the gate electrode structures 160A, 160B are laterally confined by the protective spacer elements 103, while the spacers 105S and 104, as well as the spacer layer 105 and the dielectric cap materials 164 (FIG. 1a) have been removed on the basis of an etch sequence using, for instance, hot phosphoric acid for removing silicon nitride materials, wherein the spacer 104 may provide the integrity of the protective spacer elements 103. Thereafter, the spacer 104 may be removed by performing a wet chemical etch process based on hydrofluoric acid (HF).

FIG. 1c schematically illustrates the semiconductor device 100 in a further advanced manufacturing stage. In this stage, the transistors 150A, 150B comprise an offset spacer element 153 in combination with a spacer structure 156, which may be used for forming drain and source regions 157 so as to obtain the desired vertical and lateral dopant profile. For this purpose, well-established process strategies, including the deposition of silicon nitride-based materials on the basis of low pressure CVD techniques, in combination with the deposition of any etch stop liners (not shown), may be applied, while at the corresponding stages, implantation processes are also performed so as to incorporate the drain and source dopant species, possibly in combination with any counter-doping species, as required for adjusting the final transistor characteristics, such as the off current of the transistors and the like. Finally, an anneal process 107 may be performed to activate the dopants in the drain and source regions 157, thereby also adjusting the final dopant profile due to a certain degree of dopant diffusion.

As a consequence, although superior performance of the transistor 150B may be obtained on the basis of the gate electrode structure 160B, a significantly less pronounced gain in performance may be observed for the transistor 150A, although implementing therein the strain-inducing mechanism in the form of the material 151, due to a significantly increased lateral offset of this material 151 from the channel region 152.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which the lateral offset of a strain-inducing semiconductor alloy from a gate electrode structure having formed on sidewalls thereof an appropriate encapsulating material may be reduced by providing corresponding sacrificial spacer elements acting as an etch mask and a growth mask during the incorporation of the strain-inducing semiconductor material with a reduced thickness, while nevertheless preserving the required material characteristics in terms of etch resistivity and overall chemical stability. To this end, the corresponding spacer layer may be formed on the basis of two different deposition techniques, in which a first portion or sub-layer may be formed on the basis of a highly conformal deposition technique with a reduced thickness, thereby sealing and preparing the surface for a subsequent deposition process, which may provide the material with superior density and etch resistivity, for instance on the basis of a thermally activated low pressure CVD process, which may thus result in a significantly reduced thickness. Consequently, the total thickness of the spacer layer may be reduced, which in turn may result in a reduced width of the corresponding spacer elements, thereby enabling a further reduction of the lateral offset without sacrificing integrity of the sensitive gate materials.

One illustrative method disclosed herein relates to forming a transistor. The method comprises performing a first deposition process to form a first sub-layer of a spacer layer above an active region and a gate electrode structure formed on the active region. The gate electrode structure comprises a high-k dielectric material and a dielectric cap material formed on an electrode material. The method further comprises performing a second deposition process to form a second sub-layer of the spacer layer on the first sub-layer. Additionally, a spacer is formed from the spacer layer and a portion of the active region is replaced with a strain-inducing semiconductor material by using the spacer and the dielectric cap material as a mask. Moreover, the method comprises removing the spacer and the dielectric cap material and forming drain and source regions in the active region.

A further illustrative method disclosed herein comprises performing a deposition sequence on the basis of at least two different process parameter settings so as to form a spacer layer above a first active region of a first transistor and a second active region of a second transistor, wherein the spacer layer covers a first gate electrode structure formed on a portion of the first active region. The spacer layer further covers a second gate electrode structure formed on a portion of the second active region, wherein the first and second transistors differ in their conductivity type. The method additionally comprises forming a spacer element selectively on sidewalls of the first gate electrode structure from the spacer layer and preserving the spacer layer above the second active region. Moreover, the method comprises forming a strain-inducing semiconductor material in the first active region by using the spacer element and the spacer layer as a mask. Thereafter, the spacer element and the spacer layer are removed and drain and source regions are formed in the first and second active regions.

A still further illustrative method disclosed herein relates to forming a semiconductor device. The method comprises forming a protective spacer element on sidewalls of a gate electrode structure that is formed on a semiconductor region. The method further comprises forming a sacrificial spacer element on the protective spacer element and performing a deposition sequence so as to deposit a spacer layer above the gate electrode structure that comprises the protective spacer element and the sacrificial spacer element. The deposition sequence includes a multi-step deposition process and a low pressure chemical vapor deposition process. The method additionally comprises forming a spacer element from the spacer layer and forming a strain-inducing semiconductor material in the active region. Furthermore, the spacer element is removed and a sidewall spacer structure is formed after removal of the spacer element. Additionally, the method comprises forming drain and source regions in the semiconductor region by using the sidewall spacer structure as an implantation mask.

BRIEF DESCRIPTION OF THE DRAWINGS

The disclosure may be understood by reference to the following description taken in conjunction with the accompanying drawings, in which like reference numerals identify like elements, and in which.

Figure 1A:
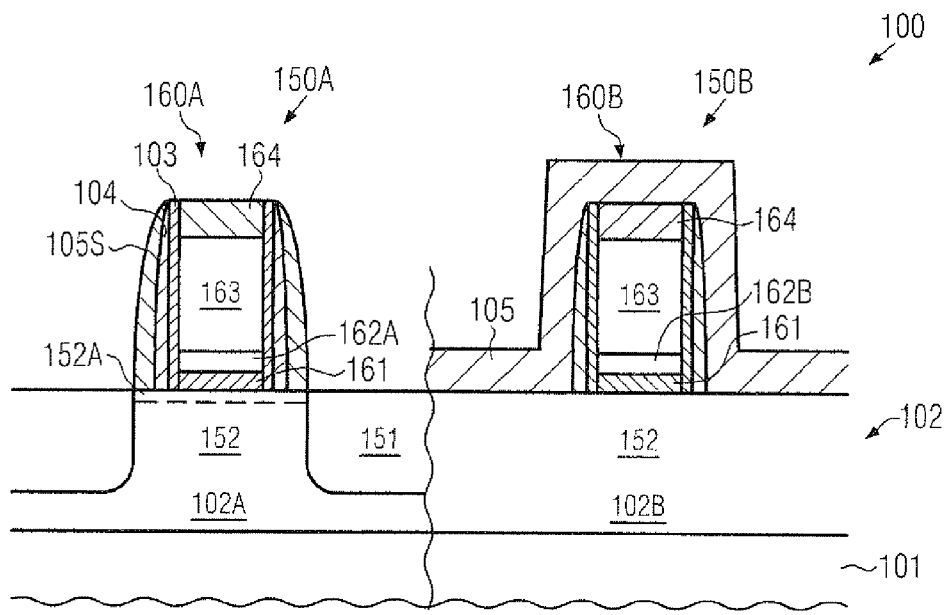
FIGS. 1a-1c schematically illustrate cross-sectional views of a semiconductor device during various manufacturing stages in fabricating sophisticated transistor elements including a high-k metal gate electrode structure and a strain-inducing semiconductor alloy on the basis of conventional process strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides manufacturing techniques in which a sacrificial or disposable spacer element may be formed on protective or encapsulating spacer elements formed on sidewalls of a high-k metal gate electrode structure, wherein the disposable spacer may have superior conformality and a reduced width, while at the same time providing the desired material characteristics with respect to etch resistivity, thermal stability and the like. For this purpose, the spacer layer for the disposable spacer element may be provided on the basis of two different deposition techniques in which a first relatively thin silicon nitride material may be deposited by a multi-layer deposition process, thereby obtaining a thin and highly conformal base layer, which may then provide superior surface conditions during the deposition of a further silicon nitride material, for instance based on low pressure CVD techniques, wherein the underlying base layer may reduce any "incubation" effects that may typically be observed in low pressure CVD (LPCVD) or plasma enhanced CVD (PECVD) processes, in particular when a layer of reduced thickness is to be deposited. Consequently, in total, a reduced thickness of the spacer layer material may be achieved, while nevertheless providing the desired material characteristics, while the superior conformal deposition behavior may also provide enhanced uniformity of the entire process for incorporating a strain-inducing semiconductor material.

It should be appreciated that deposition techniques have been developed in which a process temperature of approximately 550° C. and less may be applied in which different precursor materials may be supplied to the deposition reactor in a sequential manner, thereby forming precursor layers which may then, upon supplying the next precursor material, be converted into the desired material, wherein each deposition cycle may have a self-limiting deposition behavior, as is the case in atomic layer deposition (ALD) strategies, thereby providing a high degree of controllability and conformality. In other cyclic deposition techniques, one of the precursor layers may not provide self-limiting deposition behavior, yet nevertheless providing enhanced conformality and controllability. Such a cycle, possibly not self-limiting deposition step, may be referred to herein as a "multi-layer" deposition process and may be used as an efficient deposition technique for forming a first part or sub-layer of the spacer layer. Thereafter, in a further deposition technique, for instance, in some illustrative embodiments, in the form of a LPCVD process, typically performed at temperatures of 700° C. and higher, a further silicon nitride material may be deposited while, however, substantially avoiding or at least reducing any defects at the beginning of the deposition phase, as may typically be observed in deposition processes using non-silicon nitride materials as a base layer. Consequently, due to the provision of a conformal silicon nitride material based on the multi-layer deposition, a further LPCVD silicon nitride material may be formed with superior uniformity and thus reduced thickness, while nevertheless the increased deposition temperature may provide the superior etch resistivity and overall stability of this material, as required for acting as a spacer element during the fabrication of cavities and their refilling with a strain-inducing semiconductor material.

Figure 1B:
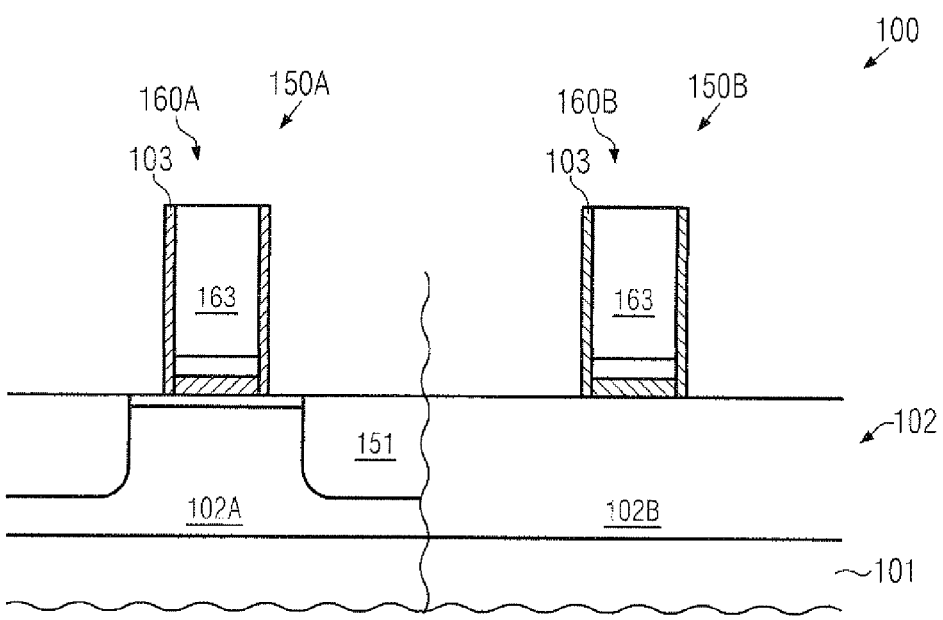
Figure 1C:
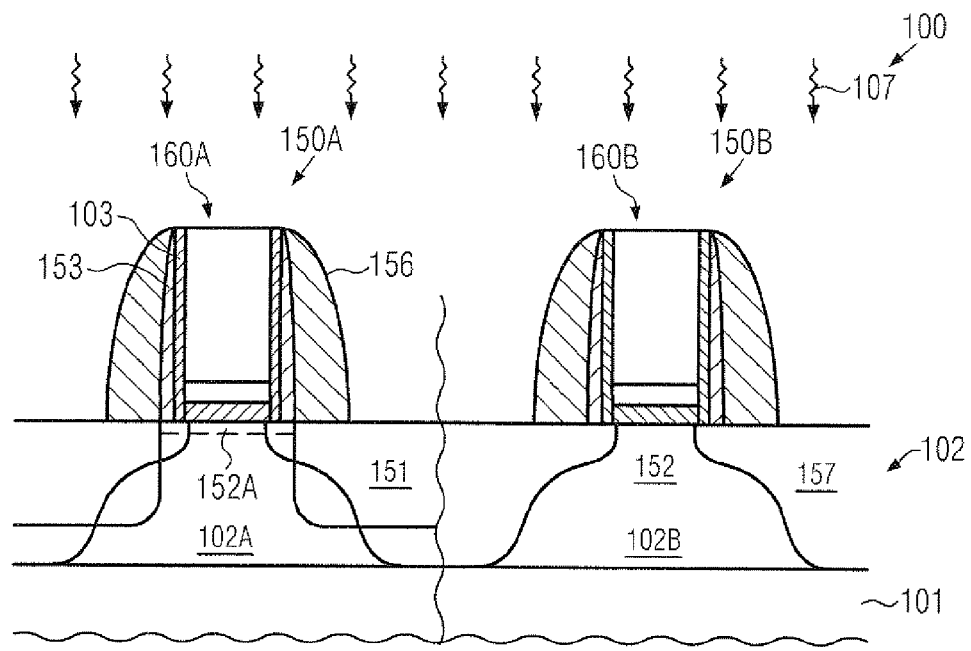

With reference to FIGS. 2a-2f, further illustrative embodiments will now be described in more detail, wherein reference may also be made to FIGS. 1a-1c, if required.

Figure 2A:
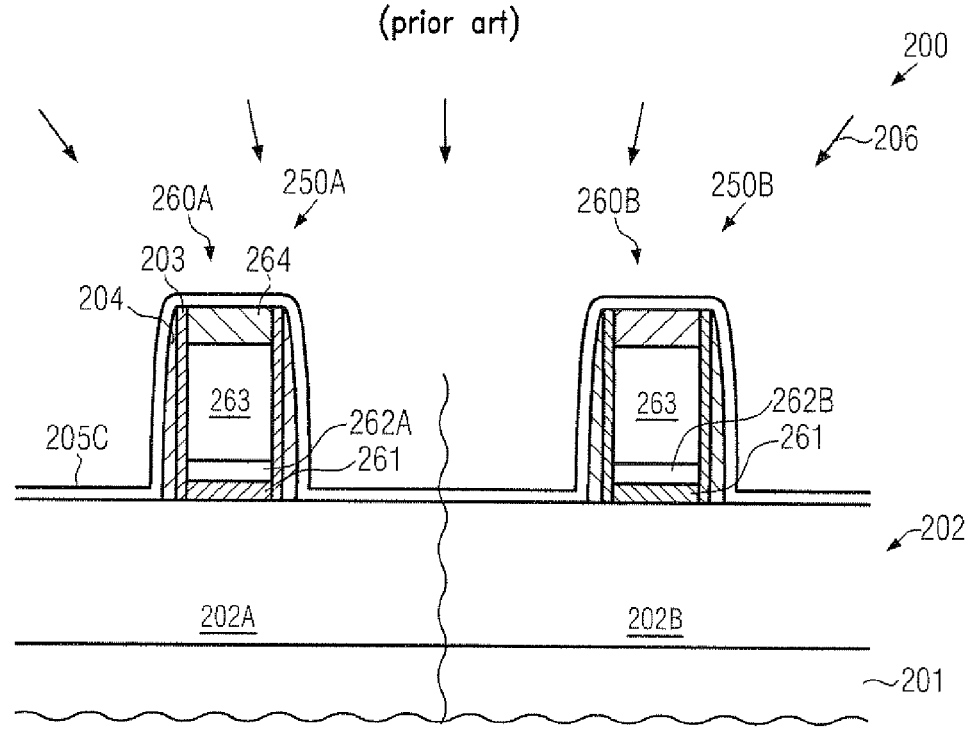
FIGS. 2a-2f schematically illustrate cross-sectional views of a semiconductor device during various manufacturing stages in which a reduced lateral offset of a strain-inducing semiconductor material from an encapsulated high-k metal gate electrode structure may be obtained on the basis of manufacturing techniques in accordance with illustrative embodiments.

FIG. 2a schematically illustrates a cross-sectional view of a semiconductor device 200 comprising a substrate 201 and a semiconductor layer 202, such as a silicon-based semiconductor material and the like. The substrate 201 and the semiconductor layer 202 may represent a bulk configuration in which the semiconductor layer 202 may represent a portion of a crystalline semiconductor material of the substrate 201, while in other cases a silicon-on-insulator (SOI) configuration may be formed by the components 202 and 201, when a buried insulating material (not shown) is formed between these two components. Furthermore, semiconductor regions or active regions 202A, 202B may be formed in the semiconductor layer 202, and may be laterally delineated by isolation structures (not shown). In the embodiment shown, the active region 202A may correspond to a transistor 250A, which may receive a strain-inducing semiconductor material in the active region 202A during the further processing. For instance, the transistor 250A may represent a P-channel transistor wherein a compressive strain-inducing semiconductor material, such as silicon/germanium, silicon/germanium/tin and the like, may be formed in a later manufacturing stage. In other cases, a tensile strain-inducing material, such as a silicon/carbon alloy and the like, may have to be provided. The active region 202B may correspond to a transistor 250B which, in the embodiment shown, may represent a transistor that does not require the incorporation of a strain-inducing material. For instance, the transistor 250B may be of inverse conductivity type compared to the transistor 250A and may, in an embodiment shown, represent an N-channel transistor. Furthermore, the transistors 250A, 250B may comprise corresponding gate electrode structures 260A, 260B, respectively, which may comprise an electrode material 263, such as a silicon material, a silicon/germanium material and the like, in combination with a dielectric cap material 264. Furthermore, a dielectric material 261, for instance in the form of a high-k dielectric material, may be provided, which may have incorporated therein a work function metal species, such as aluminum, lanthanum and the like. Moreover, an electrode metal 262A, i.e., a metal-containing conductive cap material, for instance in the form of titanium nitride, possibly in combination with other materials, may be provided on the gate dielectric materials 261. For instance, it may be assumed that the material 262A may be specifically selected with respect to the transistor 250A, while a material 262B may correspond to the transistor 250B, wherein it should be appreciated, however, that a corresponding work function adjustment may be accomplished by specifically incorporated appropriate metal species into the dielectric materials 261, while the layers 262A, 262B may have substantially the same material composition for both of the gate electrode structures 260A, 260B.

Moreover, a protective spacer element 203, such as a silicon nitride spacer, followed by a sacrificial spacer 204, may be formed on sidewalls of the gate electrode structures 260A, 260B. The spacers 203 and 204 may have any appropriate width in order to provide the required protective capabilities and etch stop behavior during the further processing of the device 200. It should further be appreciated that, for any of the components described so far, also the criteria may apply as previously explained with reference to the semiconductor device 100.

Moreover, a first portion or sub-layer 205C of a spacer layer may be formed on the active regions 202A, 202B and above the gate electrode structures 260A, 260B, i.e., on the dielectric cap material 264 and on the spacers 204. The layer 205C may be comprised of silicon nitride and may have a thickness of 0.5-2 nm, wherein a high degree of uniformity in layer thickness may also be provided due to the specific deposition technique for depositing the layer 205C.

The semiconductor device 200 as illustrated in FIG. 2a may be formed on the basis of the following processes. The active regions 202A, 202B and the gate electrode structures 260A, 260B may be formed on the basis of process techniques as are previously described above with reference to the semiconductor device 100. Thereafter, the spacers 203 and 204 may be formed by applying appropriate deposition and etch techniques, as is also previously discussed. Consequently, a width of the spacers 203, 204 may be selected in accordance with requirements for preserving integrity, in particular of the materials 261 and 262A, 262B, as is also described above with reference to the device 100. Thereafter, a multi-layer deposition process 206 may be applied in order to deposit the sub-layer 205C. For this purpose, the deposition process 206 may include a first deposition step including a deposition atmosphere including a first precursor material which may be provided in the form of ammonia ($NH_3$), when silicon nitride is to be formed on the basis of ammonia and a silicon-containing gas component, such as silane, hexachlorodisilane and the like. Ammonia gas may be converted into a reactive component in the form of $NH_2$ at a process temperature of approximately 500° C., which may adhere to the exposed surface portions of the device 200. Thereafter, a further deposition step may be performed in which a second precursor material may be introduced into the reactive atmosphere, such as a deposition reactor, for instance in the form of silane or a similar silicon-containing component, which may thus deposit on the previously formed precursor material comprised of nitrogen and hydrogen, thereby forming a silicon nitride material with a thickness of approximately 0.5 nm and higher. It should be appreciated that corresponding deposition steps for providing a first precursor material and subsequently providing the next precursor material, possibly with any intermediate purge steps, may be repeated as required in order to obtain the desired final thickness of the sublayer 205C. Due to the multi-layer deposition and the deposition mechanism, a well-controllable process may be accomplished in which the thickness may also have a high degree of uniformity at any surface area, such as substantially horizontal surface areas and substantially vertical surface areas.

Figure 2B:
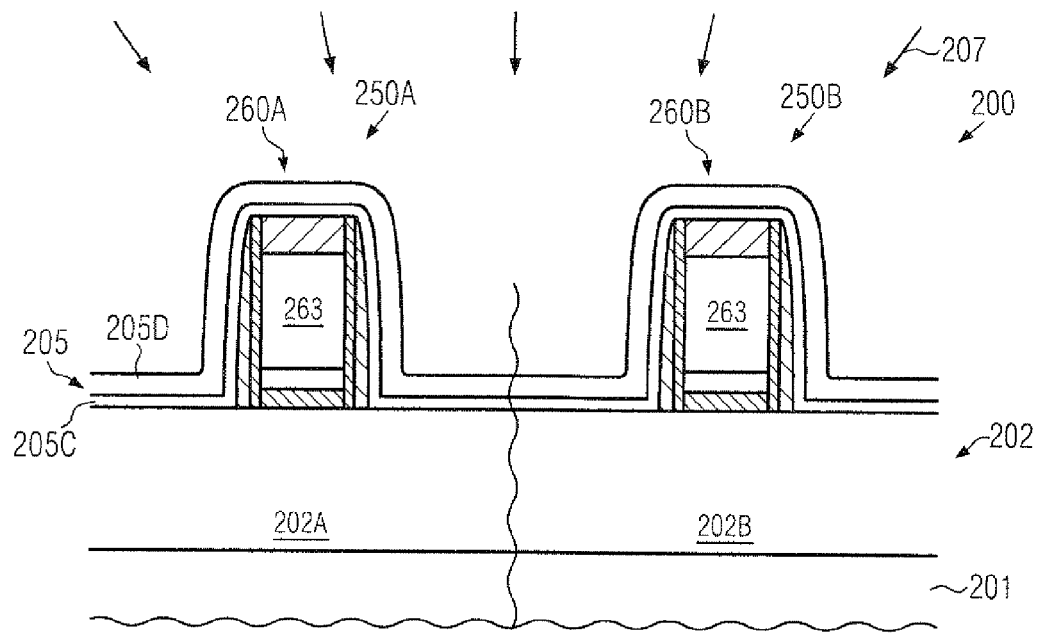

FIG. 2b schematically illustrates the semiconductor device 200 during a further deposition process 207, in which a further part or sub-layer 205D of a spacer layer 205 may be formed. It should be appreciated that the deposition processes 206 and 207 of FIGS. 2a and 2b may be performed in one and the same deposition reactor as subsequent deposition processes without exposing the device 200 to ambient atmosphere, thereby also avoiding any additional transport activities. In other cases, if required, different process tools may be used for performing the processes 206 and 207. In one illustrative embodiment, the deposition process 207 may represent a thermally activated CVD process using a process temperature of 700° C. and higher, wherein any precursor materials, as for instance specified above, may be supplied to the deposition atmosphere of the process 207 concurrently, thereby forming corresponding radicals, which may then deposit on the underlying material layer 205C. Due to the presence of the layer 205C, which may act as a seed layer, any non-uniformities during an initial phase of the process 207 may be avoided or at least reduced, thereby also obtaining a very uniform thickness of the layer 205D. For example, the layer 205D may be provided with a thickness of one nanometer to several nanometers in order to adjust the desired final thickness of the spacer layer 205 to a range as is considered appropriate for providing the required stability during the further processing. For instance, a thickness of the spacer layer 205 could be 5-10 nm. As previously explained, due to the increased deposition temperature, the chemical resistivity and stability of the layer 205D may be superior compared to the layer 205C, thereby obtaining the desired robustness of the layer 205 during the further processing at a reduced overall thickness. Moreover, due to the superior conformal deposition of the spacer layer 205 compared to conventional strategies, generally, a reduced layer thickness may be applied since the increased degree of uniformity may allow a reduction of any process margins, which may otherwise be conventionally required so as to take into consideration any thickness variations of a corresponding spacer layer.

Figure 2C:
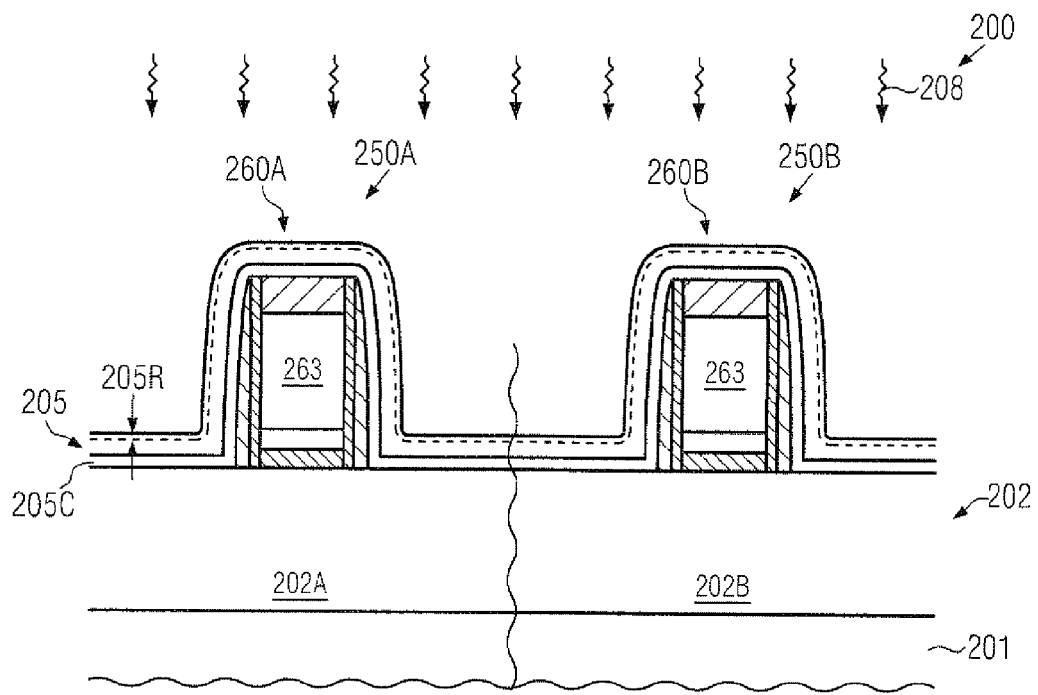

FIG. 2c schematically illustrates the semiconductor device 200 according to some illustrative embodiments in which an additional anneal process 208 may be performed on the basis of the spacer layer 205. For example, the anneal process 208 may be performed at temperatures of approximately 800-1100° C. in order to "densify" the material of the spacer layer 205, thereby imparting even further enhanced stability characteristics and also further reducing a thickness of the layer 205. For instance, as indicated by 205R, a certain degree of shrinkage may occur during the anneal process 208, thereby reducing the initial thickness by approximately 5-15 percent, depending on the parameters of the anneal process 208. It should be appreciated that desired process parameters, such as duration, anneal temperature, gaseous ambient and the like, may be readily determined by conducting experiments and the like.

Figure 2D:
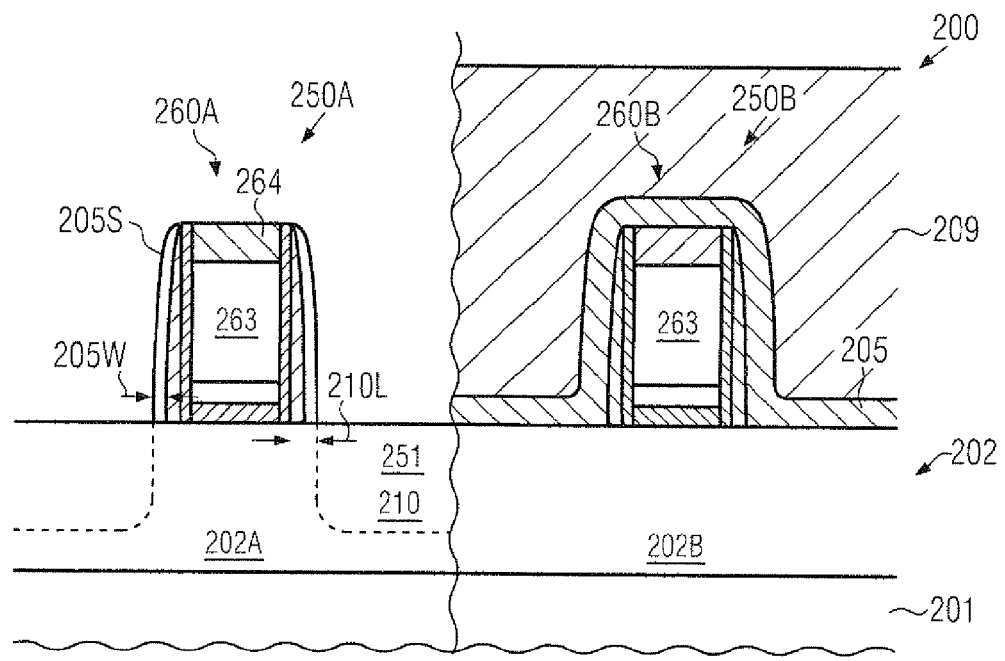

FIG. 2d schematically illustrates the semiconductor device 200 in a further advanced manufacturing stage in which an etch mask 209, such as a resist material, is formed above the transistor 250B, while the transistor 250A and the corresponding active region 202A are exposed. Moreover, spacer structures 205S may be formed from the spacer layer 205, which may be accomplished by using well-established plasma assisted etch recipes, thereby obtaining the spacer element 205S with a desired width 205W, which may be reduced compared to conventional strategies due to the reduced initial thickness of the spacer layer 205. After the corresponding etch process or as a further phase of a corresponding etch sequence, cavities 210 may be formed in the active region 202A, wherein the spacers 205S may act, in combination with the dielectric cap material 264, as an etch mask. Thus, a lateral offset 210L of the cavities 210 from the gate electrode structure 260A may be reduced, compared to the conventional approach, as previously described with reference to the device 100, due to the reduced width 205W. Next, the cavities 210 may be refilled or even overfilled, depending on the overall process requirements, by an appropriate strain-inducing semiconductor material 251, such as silicon/germanium, silicon/carbon and the like.

Figure 2E:
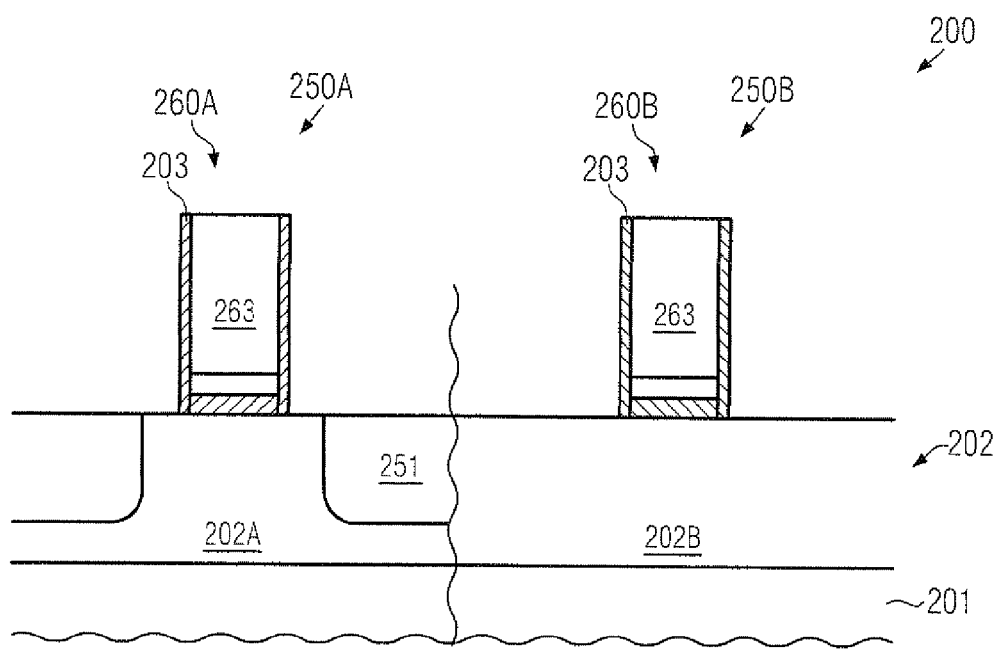

FIG. 2e schematically illustrates the semiconductor device 200 in a further advanced manufacturing stage in which a strain-inducing semiconductor material 251 may be provided in the active region 202A. Moreover, the spacer element 205S, the sacrificial spacer 204 and the dielectric cap layer 264 and the spacer layer 205 (FIG. 2d) have been removed, which may be accomplished on the basis of etch techniques as are previously discussed with reference to the semiconductor device 100.

Figure 2F:
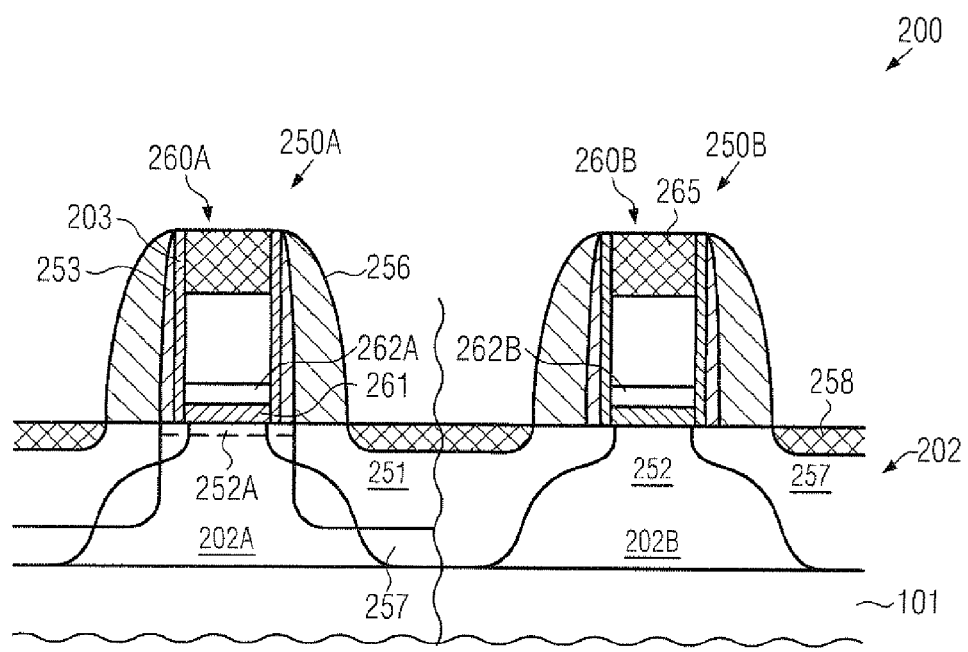

FIG. 2f schematically illustrates the semiconductor device 200 in a further advanced manufacturing stage. As illustrated, the transistors 250A, 250B may comprise drain and source regions 257 in combination with metal silicide regions 258. Furthermore, as previously discussed with reference to the semiconductor device 100, one or both of the transistors 250A, 250B may comprise an additional semiconductor material 252A within the channel region 252 in order to adjust a band gap offset, if required. As discussed earlier, the material 252A may be provided in an early manufacturing stage, i.e., prior to forming the gate electrode structures 260A, 260B. Furthermore, an offset spacer 253 in combination with an additional sidewall spacer structure 256 may be provided so as to connect to the protective spacer element 203. Moreover, a metal silicide 265 may also be formed in the gate electrode structures 260A, 260B.

The transistors 250A, 250B may be formed on the basis of any appropriate process strategy for forming the spacer elements 253, 256 in combination with appropriate implantation and masking strategies to provide the drain and source regions 257 of appropriate vertical and lateral dopant profile. During the entire process sequence, at least the protective spacer element 203 may preserve integrity of the sensitive materials 261, 262A, 262B. Thereafter, the metal silicide regions 258, 265 may be formed on the basis of any appropriate process strategy. Thereafter, the processing may be continued by depositing an interlayer dielectric material, possibly in a highly stressed state, if a further strain-inducing mechanism is to be implemented for one or both of the transistors 250A, 250B.

As a result, in sophisticated semiconductor devices, the threshold voltage of transistors comprising a high-k metal gate electrode structure may be adjusted in an early manufacturing stage, i.e., upon forming the gate electrode structure. The stability of the threshold voltage may be achieved by appropriately encapsulating the gate electrode structure after the patterning procedure, while an additional disposable spacer may be provided on the basis of a spacer layer having a reduced thickness, thereby not unduly increasing a lateral offset of a strain-inducing semiconductor material to be formed on the basis of the encapsulating spacer elements and the disposable spacer. To this end, a multi-layer deposition process may be combined with a further deposition process, such as a thermally activated low pressure CVD process, a plasma enhanced CVD process and the like. In this manner, a highly conformal silicon nitride material with the required stability may be provided at a reduced thickness compared to conventional strategies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a transistor, the method comprising:
   performing a first deposition process to form a first sub-layer of a spacer layer above an active region and a gate electrode structure formed on said active region, said gate electrode structure comprising a high-k dielectric material and a dielectric cap material formed on an electrode material, wherein forming said first sub-layer comprises providing a first precursor so as to form a preform of said first sub-layer and subsequently providing a second precursor to form at least a portion of said first sub-layer;
   performing a second deposition process to form a second sub-layer of said spacer layer on said first sub-layer;
   forming a spacer from said spacer layer;
   replacing a portion of said active region with a strain-inducing semiconductor material by using said spacer and said dielectric cap material as a mask;
   removing said spacer and said dielectric cap material; and
   forming drain and source regions in said active region.

2. The method of claim 1, wherein said first deposition process is performed at a first process temperature that is less than a second process temperature used in said second deposition process.

3. The method of claim 2, wherein said first process temperature is 550° C. or less.

4. The method of claim 3, wherein said second process temperature is 700° C. or higher.

5. The method of claim 1, further comprising performing an anneal process on at least one of said spacer layer and said spacer prior to replacing a portion of said active region with a strain-inducing semiconductor material.

6. The method of claim 1, wherein said first sub-layer is formed with a thickness of 0.2-3 nm.

7. The method of claim 6, wherein said second sub-layer is formed with a thickness of 2-5 nm.

8. The method of claim 1, wherein said first and second sub-layers comprise silicon and nitrogen.

9. The method of claim 1, wherein said first and second sub-layers are formed in the same process reactor without exposure to the ambient atmosphere.

10. The method of claim 1, further comprising forming a protective spacer structure on sidewalls of said gate electrode structure prior to forming said spacer layer.

11. The method of claim 10, wherein forming a protective spacer structure comprises forming a silicon nitride spacer on sidewalls of said gate electrode structure and forming a silicon dioxide spacer on said silicon nitride spacer.

12. The method of claim 10, wherein removing said spacer and said dielectric cap material comprises performing an etch process and using at least a portion of said protective spacer structure as an etch stop.

13. A method, comprising:
    performing a deposition sequence on the basis of at least two different process parameter settings so as to form a spacer layer above a first active region of a first transistor and a second active region of a second transistor, said spacer layer covering a first gate electrode structure formed on a portion of said first active region, said spacer layer covering a second gate electrode structure formed on a portion of said second active region, said first and second transistors differing in conductivity type, wherein said deposition sequence comprises a deposition process based on two different precursors that are to be sequentially supplied to a deposition reactor;
    forming a spacer element selectively on sidewalls of said first gate electrode structure from said spacer layer and preserving said spacer layer above said second active region;
    forming a strain-inducing semiconductor material in said first active region by using said spacer element and said spacer layer as a mask;
    removing said spacer element and said spacer layer; and
    forming drain and source regions in said first and second active regions.

14. The method of claim 13, wherein said deposition sequence further comprises a thermally activated deposition process based on a single gas ambient established in said deposition reactor.

15. The method of claim 13, further comprising forming a protective spacer element on sidewalls of said first and second gate electrode structures prior to performing said deposition sequence.

16. The method of claim 13, wherein said spacer layer is formed with a thickness of 8 nm or less.

17. A method of forming a semiconductor device, the method comprising:
    forming a protective spacer element on sidewalls of a gate electrode structure formed on a semiconductor region;
    forming a sacrificial spacer element on said protective spacer element;
    performing a deposition sequence so as to deposit a spacer layer above said gate electrode comprising said protective spacer element and said sacrificial spacer element, said deposition sequence including a multi-step deposition process and a low pressure chemical vapor deposition process;
    forming a spacer element from said spacer layer;
    forming a strain-inducing semiconductor material in said active region;
    removing said spacer element;
    forming a sidewall spacer structure after removing said spacer element; and
    forming drain and source regions in said semiconductor region by using said sidewall spacer structure as an implantation mask.

18. The method of claim 17, wherein said spacer layer is formed with a thickness of 8 nm or less.

\* \* \* \* \*